United States Patent [19]

Glass

[11] Patent Number: 4,499,061

[45] Date of Patent: Feb. 12, 1985

[54] STRONTIUM FERRITE BORATE

[75] Inventor: Howard L. Glass, Orange, Calif.

[73] Assignee: Rockwell International Corporation, El Segundo, Calif.

[21] Appl. No.: 519,796

[22] Filed: Aug. 3, 1983

[51] Int. Cl.$^3$ .............................................. C01B 33/20
[52] U.S. Cl. ................................. 423/277; 252/62.58; 252/62.63; 423/594; 423/596
[58] Field of Search ...................... 423/277, 594, 596; 252/62.58, 62.63

[56] References Cited

U.S. PATENT DOCUMENTS 4,117,058  9/1978  Micheli .............................. 252/62.58

Primary Examiner—Gary P. Straub
Assistant Examiner—Jackson Leeds
Attorney, Agent, or Firm—Gilbert H. Friedman; H. Frederick Hamann

[57] ABSTRACT

A new compound consisting essentially of strontium, iron, boron and oxygen is termed strontium ferrite borate or corabelleite. A fluxed melt for the growth of single crystals and a method for growing single crystals of the corabelleite are disclosed.

1 Claim, No Drawings

STRONTIUM FERRITE BORATE

LICENSE RIGHTS

This invention was made with Government support under Contract DAAG29-80-C-0150 awarded by the U.S. Army. The Government has certain rights in this invention.

RELATED APPLICATION

This application is related to U.S. patent application Ser. No. 519,797, A CERAMIC STRONTIUM FERRITE BORATE, filed concurrently herewith and assigned to Rockwell International Corporation, the assignee herein. Said related application is incorporated herein by reference.

BACKGROUND OF THE INVENTION

1. Field of the Invention

This invention relates to ferrites and, more particularly, pertains to a new strontium ferrite borate.

2. Description of the Prior Art

As used herein, the term ferrite refers to compounds which can be described as oxides that contain iron (Fe) as a major constituent. Ferrites often have useful magnetic properties. For example, strontium hexaferrite, $SrO.6Fe_2O_3$ or $SrFe_{12}O_{19}$, is an important material used in permanent magnets.

Closely related to strontium hexaferrite are barium hexaferrite and lead hexaferrite. As pointed out by Tokar, these three compounds form a continuous series of substitutional solid solutions. Thus, for example, lead (Pb) can replace strontium (Sr) in any proportion.

Besides permanent magnets, ferrites are used in such diverse applications as microwave and millimeter-wave devices, magneto-optical devices, and computer memories (core memories, magnetic tape, magnetic discs). Some ferrite applications require that the material be in single crystal form. Other applications can use, or may require, a polycrystalline or ceramic form.

Another kind of ferrite is iron borate, $FeBO_3$. As pointed out by Andlauer et al, this material is one of only two known compounds which combine optical transparency in the visible spectrum with spontaneous magnetization at room temperature. Therefore, iron borate is of interest for magneto-optical devices.

Single crystals of ferrites have been prepared by a variety of techniques including growth from fluxes which contain lead oxide, PbO. Linares described the growth of single crystals of yttrium iron garnet and other ferrites from barium oxide-boron oxide fluxes and mentioned the use of lead oxide-boron oxide and strontium oxide-boron oxide fluxes. The methods he used involved slow cooling of the ferrite-flux solution. Linares teaches that the only phases which form from solutions comprising ferrites dissolved in strontium oxide-boron oxide fluxes are ferrites which contain no boron and strontium borates which contain no iron. There is no indication in Linares' work that a strontium ferrite borate phase can exist.

SUMMARY OF THE INVENTION

This invention provides a new strontium ferrite borate material containing strontium, iron and boron as the major constitutents along with oxygen. The material has been named corabelleite. In single crystal form the material is transparent in the visible spectrum. The Curie temperature, below which a spontaneous magnetization exists, is near room temperature. Therefore, this material, or a modification of it, may be an addition to the rare group of optically transparent magnetic compounds.

Single crystals of this material may be prepared by growth from a flux.

DESCRIPTION OF THE PREFERRED EMBODIMENTS

In a preferred embodiment of the invention, a fluxed melt is prepared, comprising lead oxide (PbO), strontium carbonate ($SrCO_3$), boron oxide ($B_2O_3$), and iron oxide ($Fe_2O_3$). The preferred mole ratios $PbO:SrCO_3:B_2O_3$ are in the range from about 1.5:1.5:1.0 to about 1.6:1.6:1.0. The iron oxide concentration is in the range from about 7 to about 15 mole percent. These starting materials, in powdered form, are mixed in a suitable crucible (for example, platinum) and heated to a temperature which is sufficient to melt them and produce a homogeneous liquid. The temperature required for melting is about 1000° C. During the heating, the $SrCO_3$ decomposes by evolution of $CO_2$, leaving SrO in the melt. If desired, the melt can be stirred to promote homogeneity.

The melt is then cooled to a temperature (typically about 900° C. or less) at which spontaneous crystallization occurs. The crystals, which tend to float on the surface, can be dissolved by reheating the melt. Thus, by trial and error, a temperature can be found at which only one crystal, or only a few crystals, nucleate and grow. Crystals of a few millimeters diameter can be grown by this method. Larger crystals can be grown if the temperature is slowly lowered as the crystals grow. This is, in essence, the slow cooling method known to the prior art. Since the method resembles the dipping method of liquid phase epitaxy, it is believed that the method can be adapted to growth of bulk crystals or single crystal films onto suitable seed crystals or substrates.

EXAMPLE I

A melt was prepared with the objective of growing strontium hexaferrite from a $PbO-B_2O_3$ flux. The melt had the following composition: 32.3 mole percent PbO, 32.3 mole percent $SrCO_3$, 20.8 mole percent $B_2O_3$, 14.7 mole percent $Fe_2O_3$. Thus the mole ratios $PbO:SrCO_3:B_2O_3$ were 1.6:1.6:1.0 and the $Fe_2O_3$ content was nearly 15 mole percent. The starting materials, in powdered form, were mixed together and were loaded into a platinum crucible in several steps. Between steps, the crucible was heated slowly to decompose the $SrCO_3$ and to melt the mixture. The crucible was then transferred to the growth furnace. In the growth furnace the melt was heated to achieve a clear liquid. The temperatures required for this were in the range of 963° to 1013° C.

After a clear liquid was obtained, the temperature was reduced to 943° C. After more than 21 hours at this temperature, the liquid was still clear. At this time, a clean platinum wire was introduced into the furnace and, after allowing the wire to come to thermal equilibrium, the wire was inserted into the melt. The temperature was reduced five degrees. Over the course of several days, the temperature was reduced in several steps. The melt remained a clear liquid until the temperature reached 888° C. After being kept overnight at this temperature, a cluster of crystals was observed around the platinum wire. The wire was removed from the furnace and a sample of the crystals which were floating on the melt surface was scooped up on a platinum holder and removed from the furnace.

The platinum wire and the crystals from the surface of the melt were cleaned in hot, dilute acetic acid. Microscopic examination showed that many small crystals were attached to the platinum wire. These crystals were black and exhibited an apparent 6-fold crystal symmetry. The crystals from the surface of the melt were to two kinds. One kind appeared to be identical to the black, 6-fold symmetric crystals which were found on the platinum wire. The other kind were green, transparent, and had a vaguely octahedral morphology. The black crystals were strongly attracted to a magnet. The green crystals were not affected by a magnet. A sample of the black materials was ground into a powder and a Debye-Scherrer X-ray diffraction pattern was recorded. The pattern identified the sample as the hexaferrite. A sample of the green material was similarly prepared and examined. In addition, an energy dispersive X-ray spectral analysis was performed. This analysis showed that the green material contained Sr, Fe and Pb. The analysis was not sensitive to boron, which might have been present, or to oxygen, which was expected to be present. Even with this information on the combustion, the diffraction pattern of the green material could not be matched to that of any known compound.

This example, which was the first observation of the green material that is the new strontium ferrite borate, shows that this material can form simultaneously with hexaferrite. Thus, under the conditions used, there is no phase intermediate in composition between the new strontium ferrite borate and the hexaferrite phase. This example also demonstrates the growth of bulk single crystals of the new strontium ferrite borate by an isothermal, spontaneous nucleation process.

EXAMPLE II

The melt prepared for Example I was used for several experiments over a period of approximately four months. Some changes in the composition were made. Specifically, some PbO and some $SrCO_3$ were added. An unknown amount of PbO was lost by evaporation. When the experiments were completed, the melt was raised to a temperature of 1013° C. to obtain a clear liquid. Then the temperature was reduced in several steps over a period of about four weeks. During this period, crystals were observed growing on the surface of the melt. When the temperature reached 933° C., the melt surface was approximately 80 percent covered with crystals. At that point the crucible was removed from the furnace and the remaining liquid was poured out. It was noted at the time that there was very little liquid. The loss of liquid probably was a result of two factors, evaporation of PbO and overflowing due to frothing when the $SrCO_3$ had been added. After the crucible had been cleaned in hot, dilute acetic acid, irregularly shaped crystals of the green material (the new strontium ferrite borate) were found to have grown from the walls of the crucible.

Crystals from this Example were examined by several techniques. The Debye-Scherrer X-ray diffraction pattern was identical with that from Example I except for a weak, broad diffraction line at a d-spacing of 6.05 angstroms and a very weak line at 1.44 angstroms. This diffraction pattern could be completely indexed as that of a cubic crystal having a lattice constant of 15.18 angstroms. Moreover, all the lines except for the two extra lines, could be indexed as face centered cubic. The extra lines were not identified; however, they could be due to the presence of a small amount of a second phase. Single crystal diffraction patterns were obtained by the Laue back reflection method and by the Weissenberg techniques. These also showed the crystal to be face centered cubic. The possible space groups are Fm3m, F432 or F$\bar{4}$3m.

Spectrographic analysis showed that the major metallic constituents of the green material were strontium and iron. Lead was present as a minor constituent and boron also was present. Slight traces of chromium and manganese and barely detectable traces of sodium and magnesium were found. Quantitative chemical analysis for the four principal metallic constituents yielded the following weight percentages: Sr 42.0, Fe 18.4, Pb 6.0, B 1.8. However, the chemist who performed the analysis reported that there was a large uncertainty in the boron determination.

Ferromagnetic resonance measurements carried out at room temperature and at a frequency of 9.1 GHz failed to show any magnetic properties. However, when the temperature was lowered to $-32°$ C., a strong resonance at a field of 2550 Oe was observed. This value of resonance field is typical of microwave ferrite materials.

This example shows that bulk crystals of the new strontium ferrite borate can be grown by the method of slow-cooling with spontaneous nucleation. In this particular case, the crystal growth may have been aided by solvent evaporation. This example also shows that the new strontium ferrite borate has a cubic crystal structure, most probably face centered cubic. It is not magnetic at room temperature but is magnetic at temperatures less than about $-30°$ C. The major metallic constituents are Sr and Fe, but significant amounts of Pb and B are present.

EXAMPLE III

A melt was prepared similarly to that of Example I except that the concentration of $Fe_2O_3$ was lower, only 7.9 mole percent. Crystals were observed to grow on the surface of the melt at a temperature of 909° C. These crystals were scooped from the surface in a platinum holder and were cleaned in hot, dilute acetic acid. The crystals consisted primarily of the green material, that is, the new strontium ferrite borate. A second phase was also present. This second phase had a reddish color. It was not identified; however, it did not appear to be hexaferrite.

This example shows that the new strontium ferrite borate can be grown at lower values of $Fe_2O_3$ concentration that in Example I. An iron oxide concentration of 7.9 mole percent is sufficient.

EXAMPLE IV

A melt was prepared similar to that of Examples I and III except that the concentration of $Fe_2O_3$ was 9.4 mole percent. The green material, that is, the new strontium ferrite borate, crystallized along with a second phase at a temperature of 913° C.

This example shows that the new strontium ferrite borate can be grown when the $Fe_2O_3$ concentration is about 9 or 10 mole percent.

EXAMPLE V

A melt was prepared similar to that of Examples I, III and IV except that the concentration of $Fe_2O_3$ was 12.3 mole percent. Crystals were observed growing on the surface of the melt at a temperature of 963° C. The crystals were identified as the green material, that is, the new strontium ferrite borate. The $Fe_2O_3$ concentration was then increased to 13.0 mole percent. Crystals were observed to grow on the surface of the melt at 953° C. All of the crystals were identified as the green material, that is, the new strontium ferrite borate.

This example shows that there is a range of values of $Fe_2O_3$ concentration, in the vicinity of 12 to 13 mole percent, for which the new strontium ferrite borate can be crystallized as a single phase.

EXAMPLE VI

A melt was prepared without boron oxide. The composition was 42.6 mole percent PbO, 42.6 mole percent $SrCO_3$, 14.9 mole percent $Fe_2O_3$. It was not certain that a homogeneous liquid was obtained even at temperatures above 1113° C. When the crucible was cooled and cleaned in hot, dilute acetic acid, the residue consisted of two or three phases. None of these was the green, strontium ferrite borate. However, one of the phases was identified from its X-ray diffraction pattern as the cubic 2:1 phase ($2SrO.Fe_2O_3$) of Beretka and Brown. In agreement with Beretka and Brown, this phase was black. The other phases were brown or reddish.

EXAMPLE VII

A melt without boron oxide was prepared similar to that of Example VI but with a higher PbO concentration. The composition was 56.8 mole percent PbO, 28.4 mole percent $SrCO_3$, 14.9 mole percent $Fe_2O_3$. As was the case with Example VI, it did not seem to be possible to obtain a homogeneous liquid at a reasonable temperature. When the crucible was cooled and cleaned in hot, dilute acetic acid, a residue was obtained. This residue seemed to consist of two phases, both of which were brown. One phase was identified from its X-ray diffraction pattern as FeO(OH). This result suggests that the original $Fe_2O_3$ was largely unreacted.

Examples VI and VII show that $B_2O_3$ appears to be a necessary melt constituent.

EXAMPLE VIII

A melt was prepared, similar to that of Example I but with a higher concentration of $B_2O_3$. The composition was 28.1 mole percent PbO, 28.1 mole percent $SrCO_3$, 36.2 mole percent $B_2O_3$, 7.7 mole percent $Fe_2O_3$. After a homogeneous liquid was obtained and the melt was cooled in several steps, it was found that the entire surface became frozen without any clear evidence of localized crystallization. The $Fe_2O_3$ concentration was then increased in several steps. It was found that strontium borate, $SrO.B_2O_3$, was the crystallizing phase until the $Fe_2O_3$ concentration was increased to 11.1 mole percent at which point hematite, $Fe_2O_3$, was the crystallizing phase.

This example shows that if the $B_2O_3$ concentration is excessive, the crystallization of strontium ferrite borate is inhibited. This is consistent with the results of Linares. A $B_2O_3$ concentration of 36.2 mole percent is excessive.

EXAMPLE IX

A melt was prepared similar to that of Example I. The composition was 33.4 mole percent PbO, 33.4 mole percent $SrCO_3$, 21.5 mole percent $B_2O_3$, 11.7 mole percent $Fe_2O_3$. The green, new strontium ferrite borate crystallized on the surface of the melt at a temperature of 893° C. No other phase was present after cleaning in hot, dilute acetic acid. The $Fe_2O_3$ content was increased to 12.1 mole percent. Crystals began to appear on the melt surface at 893° C. The rate of growth was slow, so the temperature was lowered to 891° C. After further growth, the crystals were removed and cleaned in hot, dilute acetic acid. Only the green, new strontium ferrite borate phase was found. Subsequently, after the melt had been reheated to obtain a homogeneous liquid, crystallization was allowed to occur at 888° C. These crystals were found to consist, after cleaning in acetic acid, of the green, new strontium ferrite borate; but a small amount of a magnetic, reddish phase was also present. The $Fe_2O_3$ concentration was increased to 12.8 mole percent. Crystallization was now found to occur at about 908° C. and the crystallizing phase was the hexaferrite. This suggests that the magnetic, reddish phase which accompanied the green, new strontium ferrite borate was also hexaferrite.

This example shows that the actual temperatures at which the new strontium ferrite crystallizes are less than or about 900° C.

EXAMPLE X

A melt was prepared similar to that of Example I. The composition was 32.7 mole percent PbO, 32.7 mole percent $SrCO_3$, 21.1 mole percent $B_2O_3$ and 13.4 mole percent $Fe_2O_3$. Self nucleated crystals grew on the surface of the melt at a temperature of 913° C. All of these crystals appeared to be the green strontium ferrite borate. Chemical analysis of a group of these crystals yielded the following results: From emission spectroscopy the major constituents by weight percent were found to be strontium and iron, minor constituents were boron and lead. Slight traces (<0.01 weight percent) of silicon, manganese, chromium, silver, copper and magnesium were detected. Quantitative chemical analysis for the major and minor constituents showed: strontium 38.0 weight percent, lead 8.6 weight percent, iron 18.0 weight percent, boron 3.9 weight percent.

If we assume that all of the iron is in the form of $Fe^{3+}$, then the chemical analysis gives the following basic formula for a Pb-free form of this strontium ferrite borate:

$$3SrO.Fe_2O_3.B_2O_3.$$

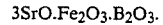

It is known from the work by Lucchini et al and others that there exists a different compound which is a borate-free strontium ferrite in which the iron can be in a 3+ or 4+ form. The chemical formula of this borate-free strontium ferrite is $$Sr_3Fe_2O_{7-y}.$$

In this formula, y=0 if all the iron is in the 4+ form; y=1 if all the iron is in the 3+ form; y has values between 0 and 1 if some of the iron is 3+ and some 4+. In this compound, y=0 may be considered the normal (fully oxidized) condition. The value of y will deviate from zero if there is an oxygen deficiency. For example, if the compound is heated in an atmosphere which is not sufficiently rich in oxygen, some oxygen atoms will leave the material. The resulting oxygen vacancies in the crystal structure will cause some of the iron to be reduced in valence from 4+ to 3+.

A far more common case is oxygen deficiency causing reduction of 3+ iron to 2+. This is more common in the sense that compounds having iron mainly in the 3+ state are far more common than compounds having iron in the 4+ state. In part this is related to crystal structure since there is an interrelationship between the crystal structure and the number of oxygen atoms which are available to each iron atom.

At the present time, knowledge of the crystal structure and crystal chemistry of this new strontium ferrite borate is not sufficient to ascertain the valence state of the iron. Considering the conditions of formation, moderate temperatures in air (rather than in vacuum or in pure oxygen), it is probable that the iron is essentially all in the 3+ state. Thus, the formula has been written $$3SrO \cdot Fe_2O_3 \cdot B_2O_3.$$

To allow for the possibility that some of the iron is 2+ or 4+, it may be convenient to use a modification of the formula for the Lucchini et al compound; namely, $$Sr_3Fe_2O_{7-y} \cdot B_2O_3.$$

In this formula y will take on values between 0 and 1 if the valence of iron varies between 4+ and 3+. If the valence of iron varies between 3+ and 2+, then y will take on values between 1 and 2.

In the crystals grown from PbO containing fluxes, there will be some incorporation of Pb. This is expected to take the form of Pb substituting for some of the Sr. Thus the formulas for these crystals may be written $$3(Sr_{1-x}Pb_x)O \cdot Fe_2O_3 \cdot B_2O_3$$

and $$(Sr_{1-x}Pb_x)_3Fe_2O_{7-y} \cdot B_2O_3$$

where, for this particular sample of Example X, x=0.087.

EXAMPLE XI

A melt of the following composition was prepared: 33.2 mole percent PbO, 33.2 mole percent SrCO$_3$, 21.4 mole percent B$_2$O$_3$, 12.1 mole percent Fe$_2$O$_3$. The melt preparation was similar to that of Example I except that the platinum crucible was covered by a tight-fitting platinum lid. The crucible was placed into a furnace and heated to 1000° C. in several steps. The 1000° C. temperature was maintained for about 24 hours. Then the temperature was reduced at a rate of 3° C. per hour until a temperature of 714° C. was reached. At that point, the furnace was turned off. After the crucible had cooled to room temperature, it was removed from the furnace. It was seen to contain green octahedra which appeared to be the new strontium ferrite borate. Other phases, including one which appeared to be strontium hexaferrite, were seen. To extract the crystals from the solidified melt, the crucible was subjected to a prolonged soak in hot, dilute acetic acid. The resulting residue was found to consist mostly of strontium hexaferrite with a small amount of the green, new strontium ferrite borate. Some hematite (Fe$_2$O$_3$) may also have been present. It was apparent that the prolonged soak in hot, dilute acetic acid caused a decomposition or dissolution of the new strontium ferrite borate or both. This was subsequently verified by observing small crystals of the new strontium ferrite borate which were placed in hot, dilute acetic acid. To avoid this problem, it will be desirable to use other methods of crystal extraction which are known to practitioners of the art. For example, at the end of the growth process, the residual liquid can be decanted instead of being allowed to solidify.

This example shows that the new strontium ferrite borate can be prepared by the conventional method of slow-cooling using a covered (sealed) crucible.

It will be recognized by those skilled in the art that, in each of the above examples, each oxide in the fluxed melt could be derived from another compound such as, for example, a carbonate or a nitrate which decomposes to form the oxide at the temperatures required for melting.

What is claimed is:

1. A compound of the formula $$(Sr_{1-x}Pb_x)_3Fe_2O_{7-y} \cdot B_2O_3$$

wherein lead substitutes for strontium in varying amounts, wherein said compound has a cubic crystal structure of lattice constant approximately 15.2 angstroms, wherein x can vary from zero to 0.087, and wherein y can vary from zero to two to account for the variation in oxygen content associated with the variable valence of iron.

* * * * *